(12) United States Patent
Hang et al.

(10) Patent No.: US 10,134,925 B2
(45) Date of Patent: Nov. 20, 2018

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Kenneth Warren Hang, Cary, NC (US); Kathryn Lynn Goetschius, Northville, MI (US); Yusuke Tachibana, Kanagawa (JP); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 5 days.

(21) Appl. No.: 15/462,053

(22) Filed: Mar. 17, 2017

(65) Prior Publication Data

US 2017/0301804 A1 Oct. 19, 2017

Related U.S. Application Data

(60) Provisional application No. 62/321,995, filed on Apr. 13, 2016.

(51) Int. Cl.
  *H01L 31/0224* (2006.01)
  *B23K 35/02* (2006.01)
  *H01B 1/16* (2006.01)
(52) U.S. Cl.
  CPC .... *H01L 31/022425* (2013.01); *B23K 35/025* (2013.01); *H01B 1/16* (2013.01)

(58) Field of Classification Search
  CPC .. H01L 31/022425; B23K 35/025; H01B 1/16
  See application file for complete search history.

(56) References Cited

U.S. PATENT DOCUMENTS

| 6,581,439 | B2 | 6/2003 | Niwa et al. |
| 7,494,607 | B2 | 2/2009 | Wang et al. |
| 8,231,934 | B2 | 7/2012 | Takeda et al. |
| 8,497,420 | B2* | 7/2013 | Carroll ................. B22F 1/0059 136/256 |
| 8,808,581 | B2 | 8/2014 | Vernooy et al. |
| 8,888,979 | B2 | 11/2014 | Nemes |
| 8,889,980 | B2 | 11/2014 | Carroll et al. |
| 8,895,843 | B2 | 11/2014 | Carroll et al. |

(Continued)

FOREIGN PATENT DOCUMENTS

| CN | 106007390 A | 10/2016 |
| CN | 106297948 A | 1/2017 |

(Continued)

OTHER PUBLICATIONS

Wang, J., "Glass viscosity and structural relaxation by parallel plate rheometry using a thermo-mechanical analyser", Materials Letters, 1997, 99-103, vol. 31.

(Continued)

*Primary Examiner* — Mohsen Ahmadi
*Assistant Examiner* — Gustavo Ramallo

(57) ABSTRACT

The present invention provides a thick-film paste composition for printing the front side of a solar cell device having one or more insulating layers. The thick-film paste comprises an electrically conductive metal and a dual-frit oxide composition dispersed in an organic medium.

18 Claims, 3 Drawing Sheets

(56) References Cited

U.S. PATENT DOCUMENTS

| | | |
|---|---|---|
| 9,029,692 B2 | 5/2015 | Wang et al. |
| 9,230,709 B2 | 1/2016 | Park et al. |
| 9,257,578 B2 | 2/2016 | Wang et al. |
| 2010/0126565 A1 | 5/2010 | Takeda et al. |
| 2010/0243048 A1 | 9/2010 | Laudisio et al. |
| 2011/0143497 A1 | 6/2011 | Enomoto et al. |
| 2011/0227004 A1 | 9/2011 | Jung et al. |
| 2012/0171810 A1 | 7/2012 | Park et al. |
| 2013/0269772 A1 | 10/2013 | Wang et al. |
| 2013/0269773 A1 | 10/2013 | Wang et al. |
| 2013/0270489 A1 | 10/2013 | Wang et al. |
| 2014/0182672 A1* | 7/2014 | Park ............... H01L 31/022425 136/256 |
| 2015/0007880 A1 | 1/2015 | Son et al. |
| 2015/0027524 A1 | 1/2015 | Seyedmohammadi et al. |
| 2015/0115207 A1 | 4/2015 | Shih et al. |
| 2015/0206986 A1 | 7/2015 | Wang et al. |
| 2015/0206992 A1 | 7/2015 | Guo et al. |
| 2015/0206993 A1 | 7/2015 | Yan et al. |
| 2015/0243809 A1 | 8/2015 | Raskar et al. |
| 2015/0255185 A1* | 9/2015 | Kim ..................... C03C 8/12 252/519.21 |
| 2016/0190362 A1 | 6/2016 | Neidert et al. |
| 2016/0284891 A1 | 9/2016 | Jung et al. |
| 2016/0311721 A1 | 10/2016 | Hwang et al. |
| 2017/0044050 A1 | 2/2017 | Booth et al. |
| 2017/0144920 A1 | 5/2017 | Yeh et al. |

FOREIGN PATENT DOCUMENTS

| | | |
|---|---|---|
| CN | 106477897 A | 3/2017 |
| EP | 2980857 A1 | 2/2016 |
| JP | 06-349314 A | 12/1994 |
| JP | 2006-074483 A | 3/2006 |
| JP | 2016-150883 A | 8/2016 |
| KR | 10-2015-0054597 A | 5/2015 |
| KR | 10-2016-0008071 A | 1/2016 |
| TW | 201411657 A | 3/2014 |
| TW | 201432921 A | 8/2014 |
| WO | 2009/101874 A1 | 8/2009 |
| WO | 2010/123967 A2 | 10/2010 |
| WO | 2014/102003 A1 | 7/2014 |
| WO | 2016/203986 A1 | 12/2016 |

OTHER PUBLICATIONS

Mauro, J. et al., "Viscosity of glass-forming liquids", Proc. Natl. Acad. Sci. USA (PNAS), 2009, pp. 19780-19784, vol. 106, No. 47.

Allan, D., "Inverting the MYEGA equation for viscosity", Journal of Non-Crystalline Solids, 2012, , 440-442, vol. 358.

* cited by examiner

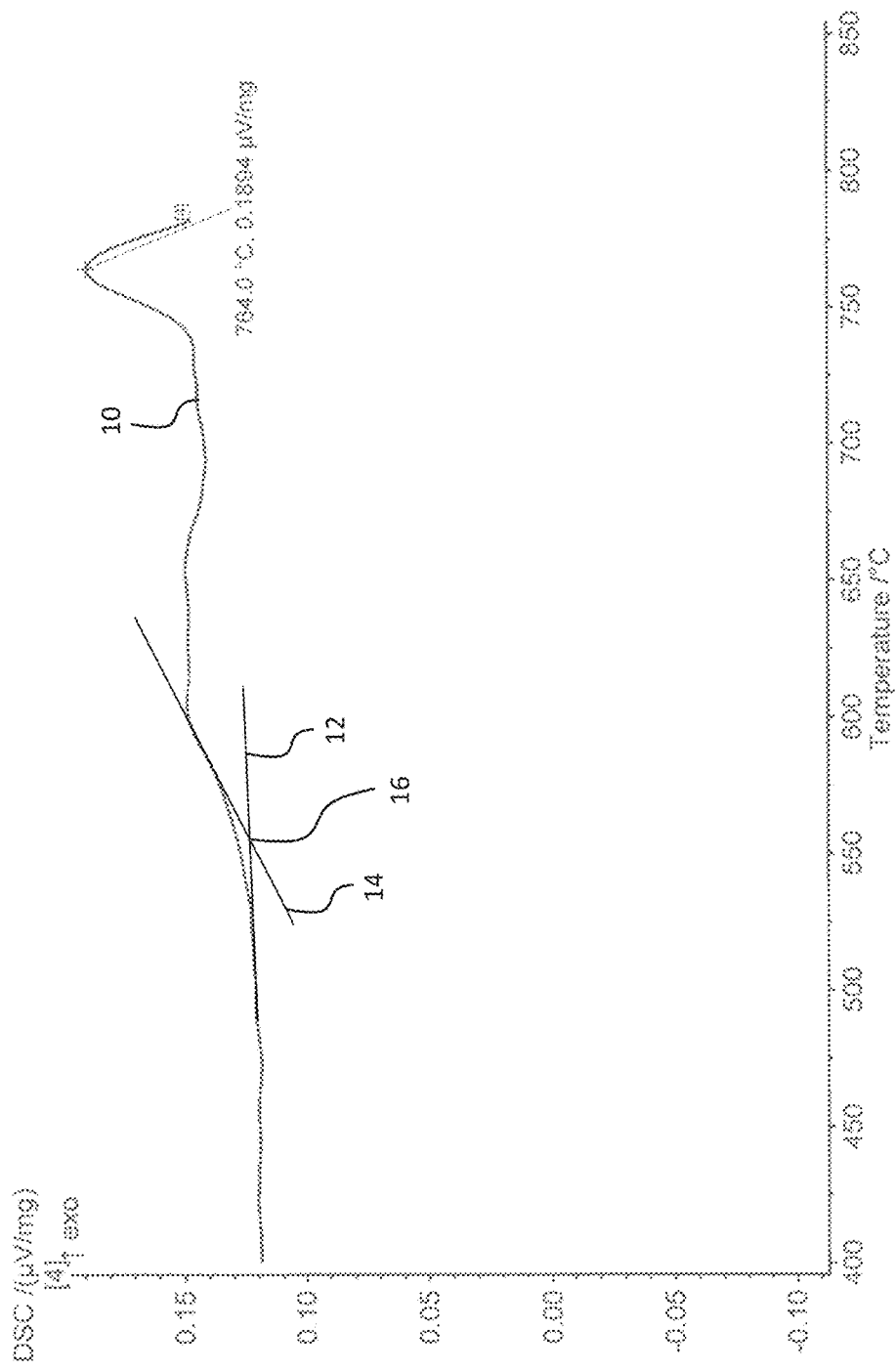

CONDUCTIVE PASTE COMPOSITION AND SEMICONDUCTOR DEVICES MADE THEREWITH

CROSS-REFERENCE TO RELATED APPLICATION

This application claims benefit of U.S. Provisional Patent Application Ser. No. 62/321,995, filed Apr. 16, 2016, and entitled "Conductive Paste Composition and Semiconductor Devices Made Therewith." Said application is incorporated herein in its entirety for all purposes by reference thereto.

FIELD OF THE INVENTION

The present disclosure relates to a conductive paste composition that is useful in the construction of a variety of electrical and electronic devices, and more particularly to a paste composition useful in creating conductive structures, including electrodes for photovoltaic devices, devices constructed with such paste compositions, and a process for constructing these devices.

TECHNICAL BACKGROUND

A conventional photovoltaic cell incorporates a semiconductor structure with a junction between semiconducting materials with different majority-carrier conductivity types, such as a p-n junction formed between an n-type semiconductor and a p-type semiconductor. More specifically, crystalline Si photovoltaic cells are typically made by adding controlled impurities (called dopants) to purified silicon, which is an intrinsic semiconductor. Dopants from IUPAC group 13 (e.g., B) are termed "acceptor dopants" and produce p-type material, in which the majority charge carriers are positive "holes," or electron vacancies. Dopants from IUPAC group 15 (e.g., P) are termed "donor dopants" and produce n-type material, in which the majority charge carriers are negative electrons. Dopants may be added to bulk materials by direct inclusion in the melt during silicon crystal growth. Doping of a surface is often accomplished by providing the dopant at the surface in either liquid or gaseous form, and then thermally treating the base semiconductor to cause the dopants to diffuse inward. Ion implantation, possibly with further heat treatment, is also used for surface doping.

When the cell is illuminated by electromagnetic radiation of an appropriate wavelength, such as sunlight, a potential (voltage) difference develops across the p-n junction as the electron-hole pair charge carriers migrate into the electric field region of the junction and become separated. The spatially separated charge carriers are collected by electrodes in contact with the semiconductor at one or both surfaces. The cell is thus adapted to supply electric current to an electrical load connected to the electrodes, thereby providing electrical energy converted from the incoming solar energy that can do useful work. Since sunlight is almost always the light source, photovoltaic cells are commonly known as "solar cells." Ideally there is a low resistance connection between each electrode and the associated device and the electrode itself has high electrical conductivity, so that the efficiency of the source in converting incident light energy to usable electrical energy is maximized, with minimal ohmic losses within the device.

Industrial photovoltaic cells are commonly provided in the form of a planar structure, such as one based on a doped crystalline silicon wafer, that has been metallized, i.e., provided with electrodes in the form of electrically conductive metal contacts through which generated current can flow. Most commonly, these electrodes are provided on opposite sides of a generally planar cell structure. Conventionally, they are produced by applying suitable conductive metal pastes to the respective surfaces of the semiconductor body and thereafter firing the pastes to form a thin metal layer.

In the common planar p-base configuration, a negative electrode is located on the side of the cell that is to be exposed to a light source (the "front," "light-receiving," or "sun" side, which in the case of an ordinary solar cell is the side exposed to sunlight); a positive electrode is located on the other side of the cell (the "back" or "non-illuminated" side). Cells having a planar n-base configuration, in which the p- and n-type regions are interchanged from the p-base configuration, are also known. Solar-powered photovoltaic systems are considered to be environmentally beneficial in that they reduce the need for burning fossil fuels in conventional electric power plants.

Photovoltaic cells are commonly fabricated with an insulating layer on their front side to afford an anti-reflective property that maximizes the utilization of incident light. However, in this configuration, a portion of the insulating layer normally must be removed to allow the overlaid front-side electrode to make contact with the underlying semiconductor surface. Conductive metal pastes appointed for fabricating front side electrodes typically include a glass frit and a conductive species (e.g., silver particles) carried in an organic medium that functions as a vehicle for printing. The electrode may be formed by depositing the paste composition in a suitable pattern (for instance, by screen printing) and thereafter firing the paste composition and substrate to dissolve or otherwise penetrate the insulating, anti-reflective layer and sinter the metal powder, such that an electrical connection with the semiconductor structure is formed.

The specific formulation of the paste composition has a strong but highly unpredictable effect on both the electrical and mechanical properties of electrodes constructed therewith. To obtain good electrical characteristics for the finished cell (e.g., high light conversion efficiency and low resistance), the composition must penetrate or etch fully through the anti-reflective layer during firing so that a good electrical contact is established, but without damaging the underlying semiconductor. However, it is also desired that a strongly adhering bond between the electrode and the substrate is formed upon firing. With many conventional paste compositions, it has not proven possible to reliably fire the printed wafers so that good adhesion and electrical properties are obtained concomitantly.

Although various methods and compositions useful in forming devices such as photovoltaic cells are known, there nevertheless remains a need for compositions that permit fabrication of patterned conductive structures that provide improved overall device electrical performance and that facilitate the rapid and efficient manufacture of such devices in both conventional and novel architectures.

SUMMARY

An embodiment of the present disclosure provides a paste composition, comprising:
an inorganic solids portion that comprises:
(a) 85 to 99.75% by weight of the solids of a source of electrically conductive metal, and (b) 0.25 to 15% by weight of the solids of an oxide-based component comprising a first fusible material and a separate second fusible material, and an organic vehicle in which the constituents of the inorganic solids portion are dispersed, and wherein the first fusible material is a lead-tellurium-based oxide and the second fusible material is a bismuth-silicon-oxide that comprises, by weight percent:
30 to 80% $Bi_2O_3$,
1 to 50% $SiO_2$,
0 to 40% ZnO,
0 to 22% $TeO_2$,
0 to 12% $B_2O_3$,
0 to 6% MgO,
0 to 9% CaO,
0 to 15% BaO,
0 to 7% $Al_2O_3$,
0 to 12% $Na_2O$,
0 to 8% $Li_2O$, and
0 to 4% $Fe_2O_3$.

Another embodiment provides a paste composition, comprising:

an inorganic solids portion that comprises:
(a) 85 to 99.75% by weight of a source of electrically conductive metal, and
(b) 0.25 to 15% by weight of an oxide-based component comprising a first fusible material having a first glass transition temperature ($T_{g1}$) and a first softening point ($T_{s1}$), and a separate second fusible material having a second glass transition temperature ($T_{g2}$) and second softening point ($T_{s2}$), $T_{g2}$ being higher than $T_{g1}$ and $T_{s2}$ being higher than $T_{s1}$, and an organic vehicle in which the constituents of the inorganic solids portion are dispersed.

A further embodiment provides a process for forming an electrically conductive structure on a substrate, the process comprising:

(a) providing a semiconductor substrate comprising an insulating layer situated on at least one surface of the semiconductor substrate;

(b) applying a paste composition onto at least a portion of the insulating layer, and (c) firing the semiconductor substrate, the insulating layer, and the paste composition, such that the insulating layer is penetrated and the electrically conductive metal is sintered, whereby an electrode that electrically contacts the semiconductor substrate is formed, wherein the paste composition comprises:
an inorganic solids portion that comprises:
(a) 85 to 99.75% by weight of the solids of a source of electrically conductive metal, and
(b) 0.25 to 15% by weight of the solids of an oxide-based component comprising a first fusible material and a separate second fusible material, and an organic vehicle in which the constituents of the inorganic solids portion are dispersed, and wherein the first fusible material is a lead-tellurium-based oxide and the second fusible material is a bismuth-silicon-oxide that comprises, by weight percent:
30 to 80% $Bi_2O_3$,
1 to 50% $SiO_2$,
0 to 40% ZnO,
0 to 22% $TeO_2$,
0 to 12% $B_2O_3$,
0 to 6% MgO,
0 to 9% CaO,
0 to 15% BaO,
0 to 7% $Al_2O_3$,
0 to 12% $Na_2O$,
0 to 8% $Li_2O$, and
0 to 4% $Fe_2O_3$.

Still another embodiment provides a process for forming an electrically conductive structure on a substrate, the process comprising:

(a) providing a semiconductor substrate comprising an insulating layer situated at least one surface of the semiconductor substrate;

(b) applying a paste composition onto at least a portion of the insulating layer, and (c) firing the semiconductor substrate, the insulating layer, and the paste composition, such that the insulating layer is penetrated and the electrically conductive metal is sintered, whereby an electrode that electrically contacts the semiconductor substrate is formed, wherein the paste composition comprises:
an inorganic solids portion that comprises:
(a) 85 to 99.75% by weight of a source of electrically conductive metal, and
(b) 0.25 to 15% by weight of an oxide-based component comprising a first fusible material having a first glass transition temperature ($T_{g1}$) and a first softening point ($T_{s1}$), and a separate second fusible material having a second glass transition temperature ($T_{g2}$) and a second softening point ($T_{s2}$), $T_{g2}$ being higher than $T_{g1}$ and $T_{s2}$ being higher than $T_{s1}$, and an organic vehicle in which the constituents of the inorganic solids portion are dispersed.

In certain of the foregoing embodiments, the difference $\Delta T_g$ is at least 100° C. and/or the difference $\Delta T_s$ is at least 100° C.

Embodiments of the present paste composition include ones in which the first fusible material is substantially silicon-free and/or the second fusible material is substantially free of tellurium and/or boron, in each instance meaning that no compound containing the respective element is used in formulating the fusible material and any present is an impurity derived from one of the constituent raw materials, as known in ordinary industrial practice.

Also disclosed are articles that are formed using the present paste composition in the practice of the foregoing processes. Such articles include semiconductor devices and photovoltaic cells. The present processes can be used to form electrodes contacting silicon semiconductors, the electrodes comprising electrically conductive structures formed by any of the processes described herein.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

10: p-type substrate;

12: first major surface (front or light-receiving side) of substrate 10;

14: second major surface (back side) of substrate 10;
20: n-type diffusion layer;
30: insulating layer;
40: p+ layer;
60: aluminum paste formed on back side;
61: aluminum back electrode (obtained by firing back-side aluminum paste);
70: silver or silver/aluminum paste formed on back side;
71: silver or silver/aluminum back electrode (obtained by firing back-side paste);
90: conductive paste as provided herein and formed on front side; and
91: conductive front electrode, formed by firing the front-side conductive paste).

Figure 3:
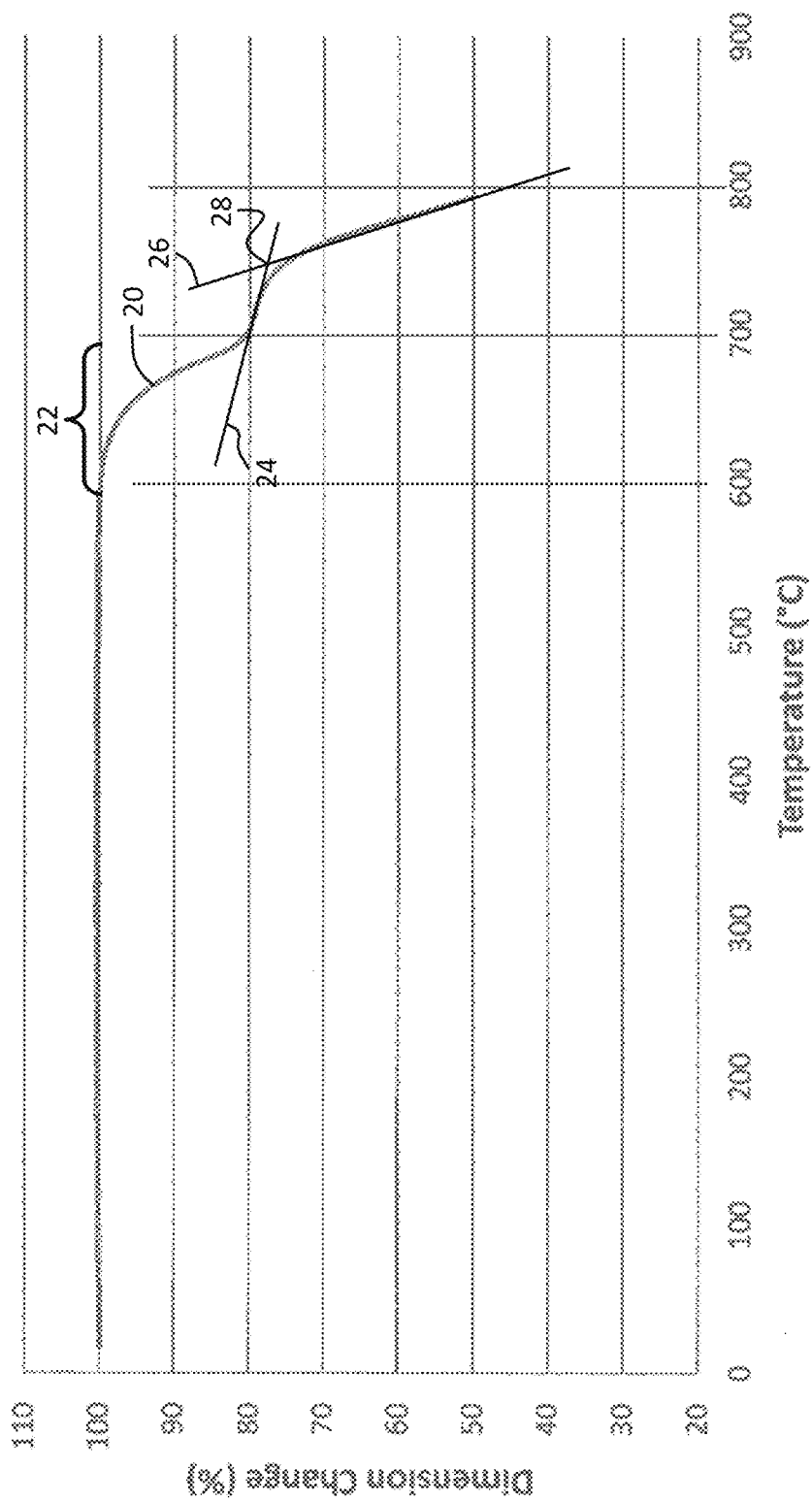

FIGS. 2 and 3 are respectively DTA and TMA traces taken on a fusible material used in the present paste composition.

DETAILED DESCRIPTION

Various aspects of the present disclosure relate to the need for high performance semiconductor and other electronic devices having mechanically robust and durable, high conductivity electrodes as well as processes suitable for their manufacture.

One aspect provides a paste composition that comprises a functional conductive component, such as a source of electrically conductive metal; an oxide-based component comprising two fusible materials; and an organic vehicle. In another aspect, the paste composition is beneficially employed in the fabrication of high-quality electrodes of photovoltaic devices. Ideally, the paste composition promotes the formation of a metallization that: (a) provides a relatively low resistance contact with the substrate; (b) preserves the electrical characteristics of the underlying substrate; and (c) adheres strongly to the underlying semi-conductor substrate. Suitable paste compositions are believed to aid in etching surface insulating layers, which are ordinarily included in semiconductor structures such as photovoltaic cells, as required for making good contact between the conductive electrode and the underlying semiconductor.

Further embodiments provide a photovoltaic cell that includes one or more conductive structures made with the present paste composition. Such cells may provide in some implementations any combination of one or more of high photovoltaic conversion efficiency, high fill factor, low series resistance, and good mechanical adhesion between the electrode and the substrate.

As further described below, the organic vehicle of the paste composition acts as a carrier for the inorganic constituents, which are dispersed therein. Along with solvent, the organic vehicle may include one or more components such as polymers, surfactants, thickeners, thixotropes, and binders that may impart desirable functional properties, including without limitation ones desirable in deposition and electrode formation processes.

Typically, electrodes or other like conductive traces are provided by screen printing the paste composition onto a substrate, although other forms of deposition may alternatively be used, including without limitation plating, extrusion or co-extrusion, dispensing from a syringe, inkjet, shaped, multiple, or ribbon printing. After deposition, the composition is fired at an elevated temperature. A separate drying step is optionally carried out prior to the actual firing.

The present composition also can be used to form conductive traces for other purposes, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices and circuitry connected thereto.

I. Inorganic Components

A. Electrically Conductive Metal

The present paste composition includes a source of an electrically conductive metal. Exemplary metals include without limitation silver, gold, copper, nickel, palladium, platinum, aluminum, and alloys and mixtures thereof. In some embodiments, the electrically conductive metal is selected from the group consisting of Ag, Cu, and Pd; alternatively, the electrically conductive metal consists essentially of silver, which is beneficial for its processability and high conductivity. However, a composition including at least some non-precious metal may be used to reduce cost or to modify other properties.

The conductive metal may be incorporated directly in the present paste composition as a metal powder. In another embodiment, a mixture of two or more such metals or an alloy is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or AgO) or silver salts such as AgCl, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used in certain embodiments. Other metals used in the present paste for the functional conductive material may be similarly derived.

Electrically conductive metal powder used in the present paste composition may be supplied as finely divided particles having any morphology, including without limitation, any one or more of the following morphologies: a powder form, a flake form, a spherical form, a rod form, a granular form, a nodular form, a layered or coated form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The particle size distribution may also be characterized by other parameters, such as $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments, Inc. (Irvine, Calif.), may also be used. In various embodiments, the median size of the metal particles is greater than 0.2 μm and less than 10 μm, or greater than 0.5 μm and less than 10 μm, or greater than 0.4 μm and less than 5 μm, or greater than 0.5 μm and less than 10 μm, as measured using the Horiba LA-910 analyzer.

As further described below, the electrically conductive metal or a source thereof can be dispersed in an organic vehicle that acts as a carrier for the metal phase and other constituents present in the formulation. The electrically conductive metal may comprise any of a variety of percentages of the composition of the paste composition. To attain high conductivity in a finished conductive structure, it is generally preferable for the concentration of the electrically conductive metal to be as high as possible while maintaining other required characteristics of the paste composition that relate to either processing or final use, such as the need for a uniform, mechanically robust and adherent contact and adequate penetration of any surface passivation and/or antireflective coating present on the substrate. Minimizing the bulk resistivity and the contact resistance between the conductive structure and the underlying device beneficially tends to decrease the source resistance of a device.

In one embodiment, the electrically conductive metal or substance from which the metal is derived comprises from about 85 to about 99.75 wt % of the solid components of the thick-film paste composition. In further embodiments, the source of the electrically conductive metal comprises from about 85, 90, 92, or 95 wt % to about 98, 99, or 99.75 wt %, based on the solid components of the thick-film paste composition.

In an embodiment, the solids portion of the thick-film paste composition includes about 85% to about 99.5% of spherical silver particles by weight of the solids. In one embodiment, the solids portion of the thick-film paste composition includes about 85 to about 90 wt % silver particles and about 1 to about 9.5 wt % silver flakes.

In another embodiment, the solids portion of the paste composition may include about 80 wt % to about 90 wt % silver particles and about 1 wt % to about 9 wt % silver flakes by weight of the solids. In an embodiment, the solids portion of the paste composition may include about 70 wt % to about 90 wt % silver particles and about 1 wt % to about 9 wt % silver flakes. In another embodiment, the solids portion of the paste composition may include about 70 wt % to about 90 wt % silver flakes and about 1 wt % to about 9 wt % of colloidal silver. In a still further embodiment, the solids portion of the paste composition may include about 60 wt % to about 90 wt % of silver particles or silver flakes and about 0.1 wt % to about 20 wt % of colloidal silver. Ordinarily, silver flakes are produced from larger particles by a grinding process, whereas particles that are approximately spherical arise from precipitation processes.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

B. Oxide Component

The present paste composition comprises an oxide component, which is understood to refer to a composition containing anions of one or more types, of which at least 80% are oxygen anions, and cations. In various embodiments, at least 90%, 95%, 98%, or substantially all the anions of the oxide component are oxygen anions.

The oxide composition incorporated in the present paste composition comprises a mixture of finely divided powders of at least two separate fusible materials that have distinct chemical compositions. The term "fusible," as used herein, refers to the ability of a material to become fluid upon heating, such as the heating employed in a firing operation. Each of the fusible materials independently may be either crystalline or partially or fully glassy or amorphous. For example, the oxide composition may comprise two or more glass materials. Glass material in the form of a fine powder, e.g., as the result of a comminution operation, is often termed "frit" and is readily employed in the present paste composition. In most embodiments, at least the first fusible material is a glass frit material. The at least two fusible materials have different softening and/or melting characteristics. In an embodiment, the different behavior operates to enhance the electrical and mechanical characteristics obtained after firing the solar cell precursor.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law.

It is to be understood that depending on its elemental content and preparation history, a fusible material that is partially or fully crystalline may comprise a single or multiple crystalline phase(s). A skilled person will recognize that melting and then solidifying a composition that does not correspond to a single crystalline phase in some instances may result in a microstructure having regions with different compositions and atomic structure, even though the various constituent elements initially were intimately mixed by complete melting. A powder X-ray diffraction pattern of such a re-solidified material would exhibit a superposition of the peaks corresponding to the crystalline phases therein. The re-solidified material is regarded as being a homogeneous, intimate mixture, even if it has a polycrystalline microstructure wherein grains of the two crystalline constituents are identifiably present, albeit intermingled, as long as the constituent atoms are intimately chemically mixed during the melting operation.

A median particle size of the fusible materials in the present composition may be in the range of about 0.5 to 10 μm, or about 0.8 to 5 μm, or about 1 to 3 μm, as measured using the Horiba LA-910 analyzer.

In various embodiments, the thick film paste may include the oxide composition in an amount of 0.25 to 8%, 0.5 to 5%, or 1 to 3% by weight based on solids.

First Fusible Material

In an embodiment, a first fusible material usefully incorporated in the present oxide composition comprises, consists essentially of, or consists of a lead-tellurium-based oxide, such as a lead-tellurium-oxide (Pb—Te—O) composition, a lead-tellurium-boron-oxide (Pb—Te—B—O) composition, a lead-tellurium-lithium-oxide (Pb—Te—Li—O) composition, or any combination thereof. Representative examples of such compositions include ones disclosed in commonly owned U.S. Pat. Nos. 8,497,420; 8,889,979; 8,895,843; and 8,889,980, all of which are incorporated herein in their entirety for all purposes by reference thereto.

In an embodiment, the first fusible material is a lead-tellurium-oxide (Pb—Te—O) composition, wherein the mole ratio of lead to tellurium in the lead-tellurium-oxide is between 5/95 and 95/5. For example, the lead-tellurium-oxide may be prepared from a mixture of PbO and $TeO_2$ powders that includes 5 to 95 mol % of PbO and 5 to 95 mol % of $TeO_2$, based on the combined powders. In other embodiments the Pb—Te—O composition comprises 25 to 85 mol %, 30 to 70 mol %, or 35 to 60 mol % of PbO, and 15 to 70 mol %, 20 to 70 mol %, or 35 to 60 mol % of $TeO_2$, based on the combined powders.

In some embodiments, the Pb—Te—O composition further comprises at least one additional constituent including, without limitation, any of $TiO_2$, $Li_2O$, $B_2O_3$, $SiO_2$, $Na_2O$, $K_2O$, $Rb_2O$, $Cs_2O$, $Al_2O_3$, MgO, CaO, SrO, BaO, $V_2O_5$, $ZrO_2$, $HfO_2$, $MoO_3$, $Ta_2O_5$, $RuO_2$, $WO_3$, $Mn_{2O3}$, $Ag_2O$, ZnO, $Ga_2O_3$, $GeO_2$, $In_2O_3$, $SnO_2$, $Sb_2O_3$, $Bi_2O_3$, $P_2O_5$, CuO, NiO, $Cr_2O_3$, $Fe_2O_3$, CoO, $Co_2O_3$, $Co_3O_4$, $Y_2O_3$, the lanthanide oxides, or mixtures thereof. (The term "lanthanide" is understood to refer collectively to the elements of the periodic table having atomic numbers of 57 through 71, i.e., La—Lu.) The total amount of these additional constituents may range from a lower limit to an upper limit, wherein the lower limit is 0, 0.25, 0.5, 1, 2, or 5 wt % and the upper limit is 10, 15, 20, or 30 wt % based on the total Pb—Te—O composition. For example, the Pb—Te—O composition may be prepared from a mixture that comprises PbO and $TeO_2$ powders and powder of one or more of the foregoing oxides. In another embodiment, the additional constituent is one or more of $SiO_2$, $B_2O_3$, $Bi_2O_3$, $Li_2O$, $SnO_2$, $Ag_2O$, ZnO, $V_2O_5$, $Al_2O_3$, $Na_2O$, MgO, $TiO_2$, $Cr_2O_3$, CuO, $ZrO_2$, $WO_3$, or $CeO_2$.

The Pb—Te—O composition may also comprise at least one oxide of one or more of Si, B, Sn, Li, Ti, Ag, Na, K, Rb, Cs, Ge, Ga, In, Ni, Zn, Mg, Ca, Sr, Ba, Se, Mo, W, Bi, Ta, V, Fe, Hf, Cr, Cd, Sb, Ru, Zr, Mn, P, Cu, Nb, Y, the lanthanide elements, or mixtures thereof, the total amount of these additional oxides ranging from a lower limit to an upper limit, wherein the lower limit is 0, 0.25, 0.5, 1, 2, or 5 wt % and the upper limit is 10, 15, 20, or 30 wt % based on the total Pb—Te—O composition.

In another embodiment, the first fusible material is a lead-tellurium-boron-oxide (Pb—Te—B—O) composition, wherein the mole ratio of lead to tellurium is between 5/95 and 95/5. Pb—Te—B—O compositions include ones that comprise 25 to 80 wt %, 30 to 75 wt %, 30 to 60 wt %, or 30 to 50 wt % PbO; 10 to 70 wt %, 20 to 65 wt %, or 25 to 60 wt % $TeO_2$; and 0.1 to 15 wt %, 0.25 to 5 wt %, or 0.4 to 2 wt % $B_2O_3$ (based on the total composition). Some embodiments further comprise at least one additional constituent including, without limitation, any of $TiO_2$, $Li_2O$, $SiO_2$, $Na_2O$, $K_2O$, $Rb_2O$, $Cs_2O$, $Al_2O_3$, MgO, CaO, SrO, BaO, $V_2O_5$, $ZrO_2$, $MoO_3$, $WO_3$, $Ta_2O_5$, $Mn_2O_3$, $Ag_2O$, ZnO, $Ga_2O_3$, $GeO_2$, $In_2O_3$, $SnO_2$, $Sb_2O_3$, $Bi_2O_3$, $P_2O_5$, CuO, NiO, $Cr_2O_3$, $Fe_2O_3$, CoO, $Co_2O_3$, $Y_2O_3$, the lanthanide oxides, or mixtures thereof, with the total amount of the additional constituents ranging from a lower limit to an upper limit, wherein the lower limit is 0, 0.25, 0.5, 1, 2, or 5 wt % and the upper limit is 10, 15, 20, or 30 wt % based on the total Pb—Te—B—O composition. The additional constituent may also be one or more of $SiO_2$, $Bi_2O_3$, $Li_2O$, $SnO_2$, $AgO_2$, ZnO, $V_2O_5$, $Al_2O_3$, $Na_2O$, MgO, $TiO_2$, $Cr_2O_3$, CuO, $ZrO_2$, $HfO_2$, $WO_3$, or $CeO_2$.

In an embodiment, one or more of the foregoing components may be 0 to 20 wt %, 0 to 15 wt %, or 0 to 10 wt % of the Pb—Te—B—O composition. In aspects of this embodiment (based on the weight of the total starting mixture):

the $SiO_2$ may be 0 to 11 wt %, 0 to 5 wt %, 0.25 to 4 wt %, or 0 to 0.5 wt %;

the $SnO_2$ may be 0 to 5 wt %, 0 to 2 wt %, or 0.5 to 1.5 wt %;

the ZnO may be 0 to 5 wt %, 0 to 3 wt %, or 2 to 3 wt %;

the $V_2O_5$ may be 0 to 5 wt %, 0 to 1 wt %, or 0.5 to 1 wt %;

the $Na_2O$ may be 0 to 5 wt %, 0 to 3 wt %, or 0.1 to 1.5 wt %;

the CuO may be 0 to 5 wt %, 0 to 3 wt %, or 2 to 3 wt %;

the $ZrO_2$ may be 0 to 3 wt %, 0 to 2 wt %, or 0.1 to 1 wt %;

the $CeO_2$ may be 0 to 5 wt %, 0 to 3 wt %, or 0.1 to 2.5 wt %;

the $Li_2O$ may be 0 to 5 wt %, 0.1 to 3 wt %, or 0.25 to 2 wt %;

the $Bi_2O_3$ may be 0 to 18 wt %, 5 to 18 wt %, or 5 to 10 wt %;

the $TiO_2$ may be 0 to 5 wt %, 0.25 to 5 wt %, or 0.25 to 2.5 wt %;

the $Al_2O_3$ may be 0 to 3 wt %, 0 to 2 wt %, or 0.1 to 2 wt %; and the $Ag_2O$ may be 0 to 10 wt %, 1 to 10 wt %, or 1 to 8 wt %.

The Pb—Te—B—O composition may also further comprise at least one oxide of one or more of Si, Na, K, Rb, Cs, Mg, Ca, Sr, Ba, V, Zr, Mo, Hf, Nb, W, Ru, Mn, Zn, B, P, Se, Sn, Ga, Ge, In, Sb, Bi, Ce, Cu, Ni, Cr, Fe, Co, Ag, Y, the lanthanide elements, or mixtures thereof with a total amount of such oxides ranging from a lower limit to an upper limit, wherein the lower limit is 0, 0.25, 0.5, 1, 2, or 5 wt % and the upper limit is 10, 15, 20, or 30 wt % based on the total Pb—Te—B—O composition.

In an embodiment, PbO, $TeO_2$, and $B_2O_3$ together may be 80 to 100 wt % of the Pb—Te—B—O composition. In further embodiments, PbO, $TeO_2$, and $B_2O_3$ together may be 85, 90, or 92 wt % to 95, 98, or 100 wt % of the Pb—Te—B—O composition.

In an embodiment, Pb—Te—O glass compositions containing $Li_2O$ have been found effective in enabling the glass to etch through $SiN_x:H_y$ and like passivation or anti-reflective layers on solar cell wafers. The other alkali metal oxides ($Na_2O$, $K_2O$, $Cs_2O$, and $Rb_2O$) are typically less effective etchants, though they may enhance other properties of the glass and so can be included beneficially as well. In various embodiments, the total alkali metal oxide content may be 0 to 5 wt %, 0.1 to 3 wt %, or 0.25 to 3 wt %.

Another possible embodiment of the first fusible material is provided by a lead-tellurium-lithium-oxide (Pb—Te—Li—O) composition, wherein the mole ratio of lead to tellurium is between 5/95 and 95/5. In an embodiment, the composition comprises 25 to 50 mol % of PbO and 50 to 75 mol % of $TeO_2$. Pb—Te—Li—O compositions also include ones that comprise: PbO in an amount from about 30, 35, 40, or 45 wt % to 50, 55, 60, or 65 wt %; $TeO_2$ in an amount from about 30, 35, 40, 45, or 50 wt % to 55, 60, or 65 wt %; and $Li_2O$ in an amount from about 0.1, 0.2, or 0.3 wt % to 1, 3, or 5 wt %, based on weight percentages in the oxide composition.

In another embodiment, the Pb—Te—Li—O composition may further comprise one or more of $SiO_2$, $SnO_2$, $Sb_2O_3$, $B_2O_3$, $Ag_2O$, $TiO_2$, ZnO, $Ga_2O_3$, $GeO_2$, $In_2O_3$, $V_2O_5$, $Na_2O$, $K_2O$, $Rb_2O$, $Cs_2O$, MgO, CaO, SrO, BaO, $ZrO_2$, $Bi_2O_3$, $Nb_2O_5$, $Ta_2O_5$, $K_2O$, MgO, $P_2O_5$, $SeO_2$, $Co_3O_4$, PdO, $RuO_2$, $WO_3$, $HfO_2$, $MoO_3$, $Ta_2O_5$, CuO, $Fe_2O_3$, NiO, MnO, $Cr_2O_3$, $Al_2O_3$, $Y_2O_3$, the lanthanide oxides, or mixtures thereof. The total amount of these additional constituents may range from a lower limit to an upper limit, wherein the lower limit is 0, 0.25, 0.5, 1, 2, or 5 wt % and the upper limit is 10, 15, 20, or 30 wt % based on the total Pb—Te—O composition.

In another embodiment, the additional constituent is one or more of $SiO_2$, $B_2O_3$, $Bi_2O_3$, $SnO_2$, $Ag_2O$, ZnO, $V_2O_5$, $Al_2O_3$, $Na_2O$, MgO, $TiO_2$, $Cr_2O_3$, CuO, $ZrO_2$, $WO_3$, or $CeO_2$. In aspects of this embodiment (based on the weight of the total starting mixture):

the $SiO_2$ may be 0 to 11 wt %, 0 to 5 wt %, 0.25 to 4 wt %, or 0 to 0.5 wt %;

the $SnO_2$ may be 0 to 5 wt %, 0 to 2 wt %, or 0.5 to 1.5 wt %;

the $B_2O_3$ may be 0 to 10 wt %, 0 to 5 wt %, or 0.5 to 5 wt %;

the $Ag_2O$ may be 0 to 30 wt %, 0 to 20 wt %, 3 to 15 wt % or 1 to 8 wt %;

the $TiO_2$ may be 0 to 5 wt %, 0.25 to 5 wt %, or 0.25 to 2.5 wt %;

the ZnO may be 0 to 5 wt %, 0 to 3 wt %, or 2 to 3 wt %;

the $V_2O_5$ may be 0 to 5 wt %, 0 to 1 wt %, or 0.5 to 1 wt %;

the $Na_2O$ may be 0 to 5 wt %, 0 to 3 wt %, or 0.1 to 1.5 wt %;

the CuO may be 0 to 5 wt %, 0 to 3 wt %, or 2 to 3 wt %;

the $ZrO_2$ may be 0 to 3 wt %, 0 to 2 wt %, or 0.1 to 1 wt %;

the $CeO_2$ may be 0 to 5 wt %, 0 to 3 wt %, or 0.1 to 2.5 wt %;

the $Bi_2O_3$ may be 0 to 20 wt %, 2 to 18 wt %, 3 to 15 wt %, or 5 to 8 wt %; and the $Al_2O_3$ may be 0 to 3 wt %, 0 to 2 wt %, or 0.1 to 2 wt %.

At noted above, $Li_2O$ is typically a more efficient etchant than the other alkali metal oxides, but the latter may still be included in the present Pb—Te—Li—O composition. In some embodiments, the total alkali metal oxide content may be 0.1 to 5 wt %, 0.1 to 3 wt %, or 0.25 to 3 wt %.

In still another embodiment, the Pb—Te—Li—O composition further comprises at least one additional constituent including, without limitation, any of $GeO_2$, $Ga_2O_3$, $In_2O_3$, NiO, CoO, ZnO, CaO, MgO, SrO, MnO, $Na_2O$, BaO, $SeO_2$, $B_2O_3$, $MoO_3$, $WO_3$, $Y_2O_3$, $As_2O_3$, $La_2O_3$, $Nd_2O_3$, $Bi_2O_3$, $Ta_2O_5$, $V_2O_5$, $Fe_2O_3$, $HfO_2$, $Cr_2O_3$, CdO, $Sb_2O_3$, $ZrO_2$, $Mn_2O_3$, $P_2O_5$, CuO, $Y_2O_3$, the lanthanide oxides, SnO, $SiO_2$, $Ag_2O$, $Nb_2O_5$, or $TiO_2$, the total amount of the additional constituents being 0.05 to 20 wt %, 0.1 to 15 wt %, or 0.25 to 10 wt % (based on the total composition).

In other embodiments the lead-tellurium-lithium-oxide further comprises at least one oxide of Si, Sn, Ti, Ag, Na, K, Rb, Cs, Ge, Ga, In, Ni, Zn, Ca, Mg, Sr, Ba, Se, Mo, W, Y, the lanthanide elements, Bi, Ta, V, Fe, Hf, Cr, B, Cd, Sb, Zr, Mn, P, Cu, or Nb.

Second Fusible Material

In an embodiment, a second fusible material usefully incorporated in the present oxide composition is a bismuth-silicon-based oxide. Some such materials comprise, consist essentially of, or consist of:

about 30 to 80 wt %, 40 to 60 wt %, or 45 to 55 wt % $Bi_2O_3$;

about 1 to 50 wt %, about 5 to 45 wt %, about 10 to 40 wt %, about 15 to 35 wt %, or about 1 to 10 wt % $SiO_2$;

0 to about 40 wt %, about 2 to 40 wt %, or about 5 to 30 wt % ZnO;

0 to about 25 wt %, 0 to about 22 wt %, 0 to about 15 wt %, or 0 to about 10 wt % $TeO_2$;

0 to about 12 wt %, 0 to about 9 wt %, 0 to about 3 wt %, or about 3 to 10 wt % $B_2O_3$;

0 to about 7 wt %, 0 to about 5 wt %, 0.1 to about 4 wt %, or about 0.25 to 3 wt % $Al_2O_3$;

0 to about 12 wt %, 0 to about 5 wt %, or 0 to about 3 wt % $Na_2O$;

0 to about 6 wt %, about 0.1 to 6 wt %, or about 1 to 5 wt % MgO;

0 to about 9 wt %, 0.1 to about 6 wt %, or about 1 to 5 wt % CaO;

0 to about 15 wt %, about 0.1 to 10 wt %, or about 1 to 5 wt % BaO;

0 to about 8 wt %, 0 to about 4 wt %, or 0 to about 2 wt % $Li_2O$; and 0 to about 4 wt %, about 0.1 to 4 wt %, about 0.5 to 3 wt %, or about 1 to 2 wt % $Fe_2O_3$.

The aggregate content of alkaline earth oxides (i.e., MgO, CaO, SrO, and BaO) in some such embodiments is at most 3, 5, 8, or 10 wt %.

In various embodiments, the second fusible material comprises from 0.5%, 1%, or 5% to 10%, 25%, or 40% of the oxide-based component by weight.

Thermal Characterization of Fusible Materials

In an embodiment, the two fusible materials herein differ significantly in their softening and/or melting behavior, e.g. as manifest in the difference between their respective glass transition and/or softening points (temperatures).

Differential scanning calorimetry (DSC) and differential thermal analysis (DTA) are techniques commonly used for analyzing glass materials, including determination of glass transition and softening points. Characteristic features of DSC or DTA data are used to describe endothermic events (heat absorbed) such as melting and exothermic events (heat released) such as crystallization. Some DSC and DTA instruments may additionally provide simultaneous thermogravimetric analysis (TGA) data. The combination of these data is often termed "simultaneous thermal analysis" or STA.

Upon initial heating, glass materials undergo certain structural changes typically denominated as the glass transition. In general, and without being bound by any theory, it is understood that there is a transition from a low temperature state in which the constituent atoms are tightly bound, to a semi-viscous state, in which thermal energy permits the atoms to become more mobile. The glass transition is manifested in changes that can be seen in measurements of a variety of physical phenomena, including without limitation calorimetric and mechanical measurements.

In accordance with typical usage in the art of glass chemistry, the term "glass transition temperature," or "$T_g$," is used herein to refer to the onset temperature for this transition as measured calorimetrically. As described in ASTM Standard Test Method E-1356-08, $T_g$ is conveniently determined empirically using conventional DSC or DTA measurements, as the temperature of intersection of two tangents drawn to the calorimetric curve, one in the baseline region below the transition region and one at the steepest portion of the curve in the transition region. (ASTM Standard Test Methods are promulgated by ASTM International;

West Conshohocken, Pa. Each such ASTM standard referenced herein is incorporated in its entirety for all purposes by reference thereto.)

$T_g$ values reported herein are obtained in accordance with this method from data taken using a Netzsch STA 449 F1, with the sample heating at a constant heating rate of 10° C./min, and with an aluminum oxide powder reference for the DTA measurements.

An example of such a determination of $T_g$ using this technique and apparatus is provided in FIG. 2. DTA trace 10 is obtained for the FM-B fusible material described hereinbelow in Examples 1-3. Baseline tangent 12 and transition region tangent 14 are constructed. The intersection point 16 of the tangents occurs at about 550° C., corresponding to the glass transition temperature $T_g$ of this sample.

The softening point of a fusible material herein is understood to represent the temperature ($T_s$) above which the logarithm (base-10) of the material's viscosity η (measured in Pa-s) drops below 6.6, in accordance with conventional usage, e.g., as set forth in "Materials Letters," Vol. 31, p 99-103 (1997) and ASTM Standard Test Method C1351M-96.

Viscosity data can be obtained for some materials in a temperature regime encompassing the temperature at which $\log(\eta)=6.6$, permitting $T_s$ to be determined directly. However, for most of the fusible materials of interest herein, $T_s$ must be inferred by extrapolation from lower temperature data. A methodology for carrying out this extrapolation was originally presented by J. C. Mauro, Y. Yue, A. J. Ellison, P. K. Gupta, and D. C. Allan, "Viscosity of Glass-Forming Liquids," Proc. Natl. Acad. Sci. USA 106, 19780-19784 (2009), which provides a model and a corresponding equation frequently termed the "MYEGA equation."

Techniques for implementing the required measurements and analysis based on the MYEGA model are known in the art, e.g., in two references, (i) U.S. Pat. No. 6,581,439, entitled "Method and Apparatus for Measuring Viscosity of Green Compact Sample, and Computer Readable Medium for Storing Method for Measuring Viscosity of Green Compact Sample" and (ii) Journal of Non Crystalline Solids, Vol. 358, Issue 2, pp. 440-442 (2012). These references provide an approach for curve fitting for extrapolating measured viscosity data to a lower temperature range using the MYEGA equation method. The '439 patent describes techniques used to exclude the influence of any bubbles on the measured viscosity data. The latter reference describes a simple mathematical artifice for inverting the original MYEGA equation to solve for temperature as a function of viscosity.

The required measurements are conveniently carried out using a TA Q400 Thermo Mechanical Analyzer (TMA), for mounting the samples and setting the active load, with measured variables of time, height, sample volume, temperature and deformation data. Samples are typically prepared in the form of a pellet of compacted powder about 6 mm in diameter and 3-10 mm high. Data are collected under a suitable small active loading (e.g. 0.1-0.5 N). A suitable heating rate can be chosen by a skilled person.

The initial part of the heating represents sintering of the sample which causes height shrinkage. Thereafter, the sample enters the viscous flow regime, providing data which are analyzed using the MYEGA extrapolation to determine $T_s$.

Another technique can be used to approximate the more accurate determination of $T_s$ done with the MYEGA extrapolation. Here, the same TMA instrument, again with a compacted pellet sample, is used to measure the height of the pellet under a constant 10° C./min heating rate and with a load of 0.1-0.5 N. An example of such a determination is provided in FIG. 3. TMA trace 20 is obtained using a sample of the same FM-B fusible material of Examples 1-3. As the sample is heated, visible shrinkage is first manifest at about 600° C., which is understood to correspond to on-going sintering of the powder sample. As the heating continues, trace 20 then shows an inflection zone as the sample enters the viscous flow regime and undergoes further height shrinkage. Baseline tangent 24 and maximum softening transition tangent 26 are constructed from the data in this region. A skilled person will recognize that the intersection point 28 at about 750° C. corresponds to the inferred, approximate softening temperature $T_s$, but likely is a overestimate by up to about 25° C.

A skilled person will recognize that due to the required construction of the tangents, there is some uncertainty in the determination of both $T_g$ and $T_s$, typically ±5-10° C.

In an embodiment, the oxide-based component of the present paste composition comprises a first fusible material having a first glass transition temperature ($T_{g1}$) and a first softening point ($T_{s1}$), and a separate second fusible material having a second glass transition temperature ($T_{g2}$) and a second softening point ($T_{s2}$), $T_{g2}$ being higher than $T_{g1}$ and $T_{s2}$ being higher than $T_{s1}$. In certain embodiments, the two materials are such that a difference $\Delta T_g=T_{g2}-T_{g1}$ is at least 100, 125, 150, 200, 250, or 300° C. In other embodiments, the two materials are such that a difference $\Delta T_s=T_{s2}-T_{s1}$ is at least 100, 150, 200, 250, 300, 350, or 400° C. Still other embodiments exhibit a combination of a large difference in both glass transition temperatures and softening points, e.g., a combination of a $\Delta T_g$ of at least 100, 125, 150, 200, 250, or 300° C. and a $\Delta T_s$ of at least 100, 150, 200, 250, 300, 350, or 400° C.

Preparation and Characterization of Fusible Materials

In an embodiment, the fusible materials comprised in the present oxide composition may be produced by conventional glass-making techniques and equipment. For example, the ingredients may be weighed and mixed in the requisite proportions and then heated in a platinum alloy crucible in a furnace. The ingredients may be heated to a peak temperature (e.g., a temperature in the range 800° C. to 1400° C., or 1000° C. to 1200° C., or 900° C. to 1100° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are homogeneously and intimately mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into a suitable quench fluid. The resulting particles are then milled to form a powder or frit, which typically may have a $d_{50}$ of 0.2 to 3.0 μm.

Other production techniques may also be used for the present fusible materials and other oxide-based materials. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

Any size-reduction method known to those skilled in the art can be employed to reduce particle size of the constituents of the present paste composition to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

One of ordinary skill in the art of glass chemistry would recognize that the fusible materials herein are described as including percentages of certain components. Specifically, the composition of these substances are specified by denominating individual components that may be combined in the specified percentages to form a starting material that subsequently is processed, e.g., as described herein, to form a glass or other fusible material. Such nomenclature is conventional to one of skill in the art. In other words, the fusible materials contain certain components, and the percentages of those components may be expressed as weight percentages of the corresponding oxide or other forms.

Alternatively, some of the compositions herein are set forth by cation percentages, which are based on the total cations contained in the particular material, unless otherwise indicated by the context. Of course, compositions thus specified include the oxygen or other anions associated with the various cations in the amounts required for charge balance. A skilled person would recognize that compositions could equivalently be specified by weight percentages of the constituents, and would be able to perform the required numerical conversions.

A skilled person would further recognize that any of the fusible materials herein, whether specified by weight percentages, molar percentages, or cation percentages, e.g. of the constituent oxides, may alternatively be prepared by supplying the required anions and cations in requisite amounts from different components that, when mixed and fired, yield the same overall composition. For example, in various embodiments, lithium for the compound $Li_2O$ could be supplied either from the oxide directly or alternatively from a suitable organic or inorganic lithium-containing compound (such as $Li_2CO_3$) that decomposes on heating to yield $Li_2O$. The skilled person would also recognize that a certain portion of volatile species, e.g., carbon dioxide, may be released during the process of making a fusible material.

It is known to those skilled in the art that the cations of some of the oxides described herein exist in more than one stable valence or oxidation state. For example, cobalt may exist in multiple possible oxidation states, with cobalt(II), cobalt(III), and cobalt(II,III) oxides, respectively having formulas $CoO$, $Co_2O_3$, and $Co_3O_4$, being reported. Fusible materials herein that include such cations can be prepared using any of the known oxides, or compounds that form oxides upon heating in air.

Although oxygen is typically the predominant anion in both the fusible materials of the present paste composition, some portion of the oxygen may be replaced chemically by fluorine or other halogen anions to alter certain properties, such as chemical, thermal, or rheological properties, of the oxide component that affect firing. In an embodiment, up to 10% of the oxygen anions of the oxide composition in any of the formulations of the present paste composition are replaced by one or more halogen anions, including fluorine. For example, up to 10% of the oxygen anions may be replaced by fluorine. Halogen anions may be supplied from halides of any of the composition's cations.

A skilled person would also recognize that a fusible material such as one prepared by a melting technique as described herein may be characterized by known analytical methods that include, but are not limited to: Inductively Coupled Plasma-Emission Spectroscopy (ICP-ES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mössbauer spectroscopy, electron microprobe Energy Dispersive Spectroscopy (EDS), electron microprobe Wavelength Dispersive Spectroscopy (WDS), and Cathodoluminescence (CL). A skilled person could calculate percentages of starting components that could be processed to yield a particular fusible material, based on results obtained with such analytical methods.

Additives

The inorganic solids portion of the present paste composition optionally includes a small amount of other known inorganic additives. One such additive that has been found useful is a lithium ruthenium oxide, as set forth in U.S. Pat. No. 8,808,581 to VerNooy et al., which is incorporated herein by reference thereto for all purposes. If present, the additives may comprise 0.01 to 1 wt % of the inorganic solids.

II. Organic Vehicle

The inorganic components of the present composition are typically mixed with an organic vehicle to form a relatively viscous material referred to as a "paste" or an "ink" that has a consistency and rheology that render it suitable for printing processes, including without limitation screen printing.

The organic vehicle typically provides a medium in which the inorganic components are dispersible with a good degree of stability of the chemical and functional properties of the paste composition. In particular, the paste composition preferably has a stability compatible not only with the requisite manufacturing, shipping, and storage, but also with conditions encountered during deposition, e.g., by a screen printing process. Ideally, the rheological properties of the vehicle are such that it lends good application properties to the paste composition, including stable and uniform dispersion of solids, appropriate viscosity and thixotropy for printing, appropriate wettability of the paste solids and the substrate on which printing will occur, a rapid drying rate after deposition, and stable firing properties. As defined herein, the organic medium is not considered to be part of the inorganic solids comprised in the thick-film paste composition.

A wide variety of inert materials can optionally be admixed in an organic medium in the present paste composition including, without limitation, an inert, non-aqueous liquid that optionally contains thickeners, binders, and/or stabilizers. By "inert" is meant a material that may be removed by a firing operation without leaving any substantial residue and that has no other effects detrimental to the paste or the final conductor line properties.

Substances useful in the formulation of the organic vehicle of the present paste composition include, without limitation, any one or more of the substances disclosed in U.S. Pat. No. 7,494,607 and International Patent Application Publication No. WO 2010/123967 A2, both of which are incorporated herein in their entirety for all purposes, by reference thereto. The disclosed substances include ethyl cellulose, ethylhydroxyethyl cellulose, wood rosin and derivatives thereof, mixtures of ethyl cellulose and phenolic resins, cellulose acetate, cellulose acetate butyrate, polymethacrylates of lower alcohols, monoalkyl ethers of ethylene glycol, monoacetate ester alcohols, and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. The organic vehicle may also include naturally-derived ingredients such as various plant-derived oils, saps, resins, or gums. Any of the polymers above or other suitable polymers may be present in the organic vehicle in any effective amount. For example, the polymer may comprise 8 to 15 wt % of the organic composition, or 0.1 wt % to 5 wt % of the total paste composition.

A preferred ester alcohol is the monoisobutyrate of 2,2,4-trimethyl-1,3-pentanediol, which is available commercially from Eastman Chemical (Kingsport, Tenn.) as TEXANOL™. Some embodiments may also incorporate volatile liquids in the organic vehicle to promote rapid hardening after application on the substrate. Various combinations of these and other solvents are formulated to provide the desired viscosity and volatility. The present paste composition may be adjusted as needed to a predetermined, screen-printable viscosity, e.g., by adding additional solvent(s).

In an embodiment, the organic vehicle may include one or more components selected from the group consisting of: bis(2-(2butoxyethoxy)ethyl) adipate, dibasic esters, octyl epoxy tallate, isotetradecanol, and a pentaerythritol ester of hydrogenated rosin. The paste composition may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

Further ingredients optionally may be incorporated in the organic vehicle, such as thickeners, stabilizers, and/or other common additives known to those skilled in the art. The organic vehicle may be a solution of one or more polymers in a solvent. Additionally, effective amounts of additives, such as surfactants or wetting agents, may be a part of the organic vehicle. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

The organic medium may comprise volatile liquids to promote rapid hardening after application of the thick-film paste composition on a substrate.

The optimal amount of organic medium in the thick-film paste composition is dependent on the method of applying the paste and the specific organic medium used.

The proportions of organic vehicle and inorganic components in the present paste composition can vary in accordance with the method of applying the paste and the kind of organic vehicle used. In an embodiment, the present paste composition typically contains about 50 to 95 wt %, 76 to 95 wt %, or 85 to 95 wt %, of the inorganic components and about 5 to 50 wt %, 5 to 24 wt %, or 5 to 15 wt %, of the organic vehicle, and substances associated therewith.

Preparation of the Thick-Film Paste Composition

The present paste composition is typically produced by combining the ingredients with a mechanical system. The constituents may be combined in any order, as long as they are uniformly dispersed and the final formulation has characteristics such that it can be successfully applied during end use. Mixing methods that provide high shear may be useful.

III. Formation of Conductive Structures

A. Substrate

An aspect of the disclosure provides a process that may be used to form a conductive structure on a substrate. Ordinarily, the process first entails the fabrication of a precursor structure of any desired configuration, generally comprising the steps of providing the substrate and applying a paste composition onto it in a suitable pattern. Then the applied paste composition and the substrate are fired to produce the conductive structure, which is often termed a "metallization." Most commonly, the substrate is planar and relatively thin, thus defining opposing first and second major surfaces on its respective sides. The present paste composition may be used to form an electrode on one or both of these major surfaces.

B. Insulating Layer

In some embodiments, the present paste composition is used in conjunction with a substrate, such as a semiconductor substrate, having an insulating or passivation or anti-reflective layer situated on one or more of the substrate's major surfaces. The layer may comprise, without limitation, one or more components selected from aluminum oxide; titanium oxide; silicon nitride; $SiN_x$: $H_y$ (non-stoichiometric silicon nitride containing hydrogen for passivation during subsequent firing processing); silicon oxide; silicon nitride, oxide, or oxynitride containing carbon; and silicon oxide/titanium oxide. There may be a single, homogeneous layer or multiple sequential sub-layers of any of these materials. Silicon nitride and $SiN_x$: $H_y$ are widely used. Passivation layers between 1 and 200 nm thick are suitable for typical applications.

In implementations for fabricating photovoltaic cells, the insulating layer is typically structured to provide an anti-reflective property, to lower the amount of incident light that is reflected from the cell's surface. Reducing the amount of light lost to reflection improves the cell's utilization of the incident light and increases the electrical current it can generate. Thus, the insulating layer is often denoted as an anti-reflective coating (ARC). The thickness of the layer preferably is chosen to maximize the anti-reflective property in accordance with the layer material's composition and refractive index. For example, the insulating ARC layer may have a thickness of between 1 and 200 nm. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In some implementations of the present process, the paste composition is useful whether the insulating layer is specifically applied or naturally occurring. The paste's oxide and non-oxide components may act in concert to combine with, dissolve, or otherwise penetrate some or all of the thickness of any insulating layer material during firing.

C. Application

The present composition can be applied as a paste onto a preselected portion of a major surface of a semiconductor substrate in a variety of different configurations or patterns, depending on the device architecture and the particular substrate material used. The preselected portion may comprise any fraction of the total area of the major surface. The area covered may range from a small fraction up to substantially all of the area. In an embodiment, the paste is applied on a semiconductor substrate, which may be single-crystal, cast mono, multi-crystal, polycrystalline, or ribbon silicon, or any other semiconductor material.

The application can be accomplished using a variety of deposition processes, including screen printing and other exemplary deposition processes discussed above. In an embodiment, the paste composition may be applied over any insulating layer present on the pertinent major surface of the substrate.

The conductive composition may be printed in any useful pattern. For example, the application of the conductive paste may be used to form a photovoltaic cell precursor, wherein the paste is deposited on a preselected portion of a semiconductor substrate in a configuration that is appointed to be converted by a firing operation into an electrically conductive structure that includes at least one electrode in electrical contact with the substrate. In an implementation, the at least one electrode is configured to be connected to outside electrical circuitry to which electrical energy is to be supplied.

The electrode pattern used for a front side electrode of a photovoltaic cell commonly includes a plurality of narrow grid lines or fingers extending from one or more larger bus bars. Such a pattern permits the current generated in the cell to be extracted from the front side without undue resistive loss, while minimizing the area obscured by the metallization, which inherently reduces the amount of incoming light energy that can be converted to electrical energy. Ideally, the features of the electrode pattern should be well defined, with a preselected thickness and shape, and have high electrical conductivity and low contact resistance with the underlying structure. Fingers that are uniform and have a high ratio of height to width are beneficial in increasing the effective conductor cross sectional area (thus decreasing electrical resistance) while minimizing the obscured area. In an embodiment, the width of the lines of the conductive fingers may be 20 to 200 µm; 25 to 100 µm; or 35 to 75 µm, or 15 to 35 µm. In an embodiment, the thickness of the lines of the conductive fingers may be 5 to 50 µm; 10 to 35 µm; or 15 to 30 µm.

D. Firing

A heat treatment operation often termed "firing" may be used in the present process to promote the formation of a conductive structure that includes an electrode providing a high-quality electrical contact with an underlying substrate, such as a semiconductor wafer in a PV (photovoltaic) cell. A drying operation optionally precedes the firing operation, and is carried out at a modest temperature to harden the paste composition, which may comprise removing its most volatile organics.

The firing operation is believed to effect a substantially complete burnout of the organic vehicle from the deposited paste by volatilization and/or pyrolysis of the organic materials. While the present invention is not limited by any particular theory of operation, it is believed that during firing, the first and second fusible materials act in concert to efficiently penetrate the insulating layer normally present on the wafer, such as a naturally-occurring or intentionally formed passivation layer and/or an anti-reflective coating. Such a result is frequently termed "firing through." The various paste components are also thought to promote sintering of the conductive metal powder, e.g. silver, that forms the electrode.

In particular, and without being bound by any theory, it is believed that as the substrate and deposited paste heat up during the firing operation, the first fusible material begins to act before the second fusible material because of the latter's higher softening or melting behavior, e.g. as manifest in higher glass transition and softening temperatures. As a result, the anti-reflective insulating layer can be penetrated at a relatively lower temperature by action of the less refractory first fusible material, lessening the likelihood of damage to the p-n junction in the cell. Once the second fusible material becomes sufficiently fluid to permit atomic mobility, it can further act. As a result, the temperature range during which adequate penetration and adherence to the sintered conductive trace is attained can be widened, making the firing operation more robust against the inevitable temperature variations experienced during a large-scale industrial process.

In an embodiment, the first fusible material is chosen for its low viscosity at temperature and capability to rapidly etch the insulating layer typically present on one or both surfaces of a photovoltaic cell. The second fusible material may be chosen to slowly blend with the first fusible material to alter its chemical activity. Preferably, the composition is such that the insulating layer is adequately removed but without deleteriously attacking the underlying emitter-diffused region, which potentially shunts the device, were the corrosive action to proceed unchecked. Such fusible materials may be characterized as having a viscosity sufficiently high to provide a stable manufacturing window to remove insulating layers without damage to the diffused p-n junction region of a semiconductor substrate.

Ideally, the firing process results in a substantially complete removal of the insulating layer without further combination with the underlying Si substrate or the formation of substantial amounts of non-conducting or poorly conducting inclusions. It is further desired that the firing provide an electrode that has good electrical properties, including a high bulk conductivity and a low surface resistivity connection to the underlying semiconductor material, thereby reducing the source impedance of the cell. While some embodiments may function with electrical contact that is limited to conductive domains dispersed over the printed area, it is preferred that the contact be uniform over substantially the entire printed area. It is also beneficial for the conductive metal structure to be mechanically robust and securely attached to the substrate, with a metallurgical bond being formed over substantially all the area of the substrate covered by the conductive element.

Such a paste would further enable screen-printed crystalline silicon solar cells to have reduced saturation current density at the front surface (J0e) and accompanying increased Voc and Jsc, and therefore improved solar cell performance. Other desirable characteristics of a paste would include high bulk conductivity and the ability to form narrow, high-aspect-ratio contact lines in a metallization pattern to further reduce series resistance and minimize shading of incident light by the electrodes, as well as good adherence to the substrate.

In one embodiment, the set point temperature of the oven or furnace for the firing may be in the range between about 300° C. and about 1000° C., or between about 300° C. and about 525° C., or between about 300° C. and about 650° C., or between about 650° C. and about 950° C. The firing may be conducted using any suitable heat source, and may be performed in an atmosphere composed of air, nitrogen, an inert gas, or an oxygen-containing mixture such as a mixed gas of oxygen and nitrogen.

In an embodiment, the firing is accomplished using a belt furnace. The substrate bearing the printed paste composition pattern is placed on a belt that is conveyed through the furnace's hot zone at high transport rates, for example between about 100 to about 500 cm per minute, with resulting hold-up times between about 0.05 to about 5 minutes. Multiple temperature zones may be used to control the desired thermal profile in the furnace, and the number of zones may vary, for example, between 3 to 11 zones. The temperature of a firing operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

E. Semiconductor Device Manufacture

An embodiment of the present disclosure relates to a device structure comprising a substrate and a conductive electrode, which may be formed by the process described above.

Conductive structures as provided herein may be usefully employed in a wide range of electrical, electronic, and semiconductor devices. Without limitation, such devices include photodiodes, photovoltaic cells, and solar panels or other like articles, in which one or more conductive structures function as electrodes through which the device can be connected to other electrical circuitry. Devices that are individually or collectively fabricated using processes disclosed herein may be incorporated into larger structures, such as a solar panel including a plurality of interconnected photovoltaic cells.

One possible sequence of steps implementing the present process for manufacture of a photovoltaic cell device is depicted by FIGS. 1A-1F. While the process is described with reference to a conventional p-base cell having a planar architecture, comparable steps useful in fabricating planar n-base cells or cells having other architectures such as interdigitated back contact cells will also be apparent.

Figure 1A:
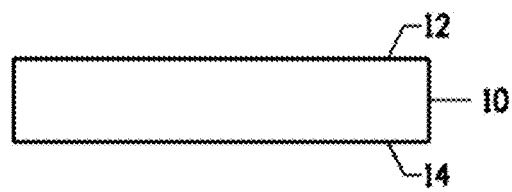
FIGS. 1A-1F illustrate successive steps of a process by which a semiconductor device may be fabricated. The device in turn may be incorporated into a photovoltaic cell. Reference numerals as used in FIGS. 1A-1F include the following.

FIG. 1A shows a p-type substrate 10, which may be any known type of Si including, without limitation, single-crystal, multi-crystalline, mono-crystalline, or polycrystalline silicon. For example, substrate 10 may be obtained by slicing a thin layer from an ingot that has been formed from a pulling or casting process. In an implementation, the Si ingot is doped with B to render it p-type. Surface damage and contamination (from slicing with a wire saw, for example) may be removed by etching away about 10 to 20 µm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Although not specifically depicted, substrate 10 may have a first major surface 12 that is textured to reduce light reflection. Texturing may be produced by etching a major surface with an aqueous alkali solution such as aqueous potassium hydroxide or aqueous sodium hydroxide. Substrate 10 may also be formed from a silicon ribbon.

Figure 1B:

In FIG. 1B, an n-type diffusion layer 20 is formed to create a p-n junction with p-type material below. The n-type diffusion layer 20 can be formed by any suitable doping process, such as thermal diffusion of phosphorus (P) provided from phosphorus oxychloride ($POCl_3$) or ion implantation. As shown, the n-type diffusion layer 20 is formed over the entire surface of the silicon p-type substrate. In other implementations, the diffusion layer is confined to the top major surface, obviating the need for the removal process described below. The depth of the diffusion layer can be varied by controlling the diffusion temperature and time, and is generally formed in a thickness range of about 0.3 to 0.5 µm. The n-type diffusion layer may have a sheet resistivity ranging from several tens of ohms per square up to about 120 ohms per square. In some alternative implementations (not shown), additional doping with B at a level above that of the bulk is added in a layer on second (rear) major surface 14.

Figure 1C:

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
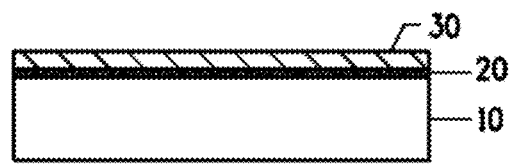

Next, as shown in FIG. 1D, an insulating layer 30, which also functions as an anti-reflective coating, is formed on the n-type diffusion layer 20. The insulating layer is commonly silicon nitride (SiN), but can also be a layer of another material, such as $SiN_x$:H (i.e., the insulating layer is non-stoichiometric SiN that comprises hydrogen for passivation during subsequent firing processing), titanium oxide, silicon oxide, mixed silicon oxide/titanium oxide, or aluminum oxide. In various embodiments, the insulating layer can be in the form of a single layer or multiple layers of the same or different materials.

Figure 1E:
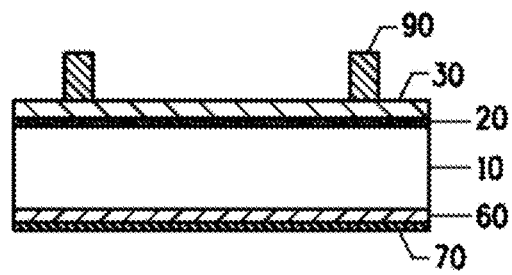

Next, electrodes are formed on both major surfaces 12 and 14 of the substrate. As shown in FIG. 1E, a paste composition 90 as provided herein is screen printed on the insulating layer 30 of the first major surface 12 and then dried. For a photovoltaic cell, paste composition 90 is typically applied in a predetermined pattern of conductive lines extending perpendicularly from one or more bus bars that occupy a predetermined portion of the surface. In addition, aluminum paste 60 and back-side silver paste 70 are screen printed onto the back side (the second major surface 14 of the substrate) and successively dried. The screen printing operations may be carried out in any order. For the sake of production efficiency, all these pastes are typically processed by co-firing them, typically at a temperature in the range of about 700° C. to about 975° C. for a period of from several seconds to several tens of minutes in air or an oxygen-containing atmosphere. An infrared-heated belt furnace is conveniently used for high throughput.

Figure 1F:
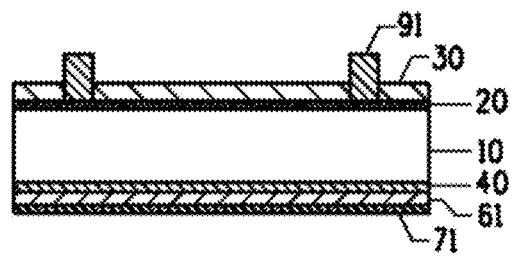

As shown in FIG. 1F, the firing causes the depicted paste composition 90 on the front side to sinter and penetrate through the insulating layer 30, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing thus converts paste 90 into electrode 91, as shown in FIG. 1F.

The firing further causes aluminum to diffuse from the back-side aluminum paste 60 into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. It is believed that during firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, silver or silver/aluminum back electrode 71 is formed on the back side as an electrode to permit soldered attachment of interconnecting copper ribbons or the like. Although silver paste 70 is depicted as covering the same area as aluminum paste 60, it is sufficient for electrode 71 to cover a limited area that still accommodates this solder attachment.

A semiconductor device fabricated as described above may be incorporated into a photovoltaic cell. In another embodiment, a photovoltaic cell array includes a plurality of the aforementioned semiconductor devices as described. The devices of the array may be made using a process described herein.

It will be apparent that similar processes can be used to fabricate conductive structures in photovoltaic cells having other architectures or other electrical, electronic, and semiconductor devices, all of which are contemplated within the scope of the present disclosure.

EXAMPLES

The operation and effects of certain embodiments of the present invention may be more fully appreciated from a series of examples (Examples 1-6) described below, and comparison of those examples with Comparative Examples 1-2. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Oxide Component Preparation

The fusible materials for the oxide component of the present conductive paste can be prepared using any suitable technique, including ones generally employed in the glass-making arts. Generally stated, the fusible materials used in the following paste preparations herein are prepared by blending the requisite solid oxides or other suitable precursors (e.g., carbonates). The blend is then heated in a Pt crucible and held at a temperature sufficient to melt the constituents together, and thereafter is poured onto a stainless steel quench plate. The solidified mass is ground to coarse powder and then ball milled to attain a desired small particle size, such as a $d_{90}$ (measured using a Horiba LA-910 analyzer) of 2 to 3 μm. Typically, the milling is carried out in a polyethylene container with zirconia media and isopropyl alcohol or water optionally containing 0.5 wt % TRITON™ X-100 octylphenol ethoxylate surfactant (available from Dow Chemical Company, Midland, Mich.). The comminuted powder is recovered by centrifugation or filtration and then dried.

Silver Powder

The Ag powder used in the exemplary paste compositions below is finely divided and may have a predominantly spherical shape, with a particle size distribution having a $d_{50}$ of about 2 μm (as measured in an isopropyl alcohol dispersion using a Horiba LA-910 analyzer).

Organic Vehicle

The organic vehicle is prepared as a masterbatch using a planetary, centrifugal Thinky® mixer (available from Thinky® USA, Inc., Laguna Hills, Calif.) to mix the ingredients. A suitable formulation is listed in Table I below, with percentages given by weight. TEXANOL™ ester alcohol solvent is available from Eastman Chemical Company, Kingsport, Tenn. In some implementations, certain of the vehicle components (e.g., resin or cellulose) are optionally first mixed with a portion of the solvent and heated to effect dissolution and thereafter added to the remainder of the masterbatch. A small percentage of the nominal solvent content is typically held back to permit later viscosity adjustment, as further described below.

TABLE I

Organic Vehicle Composition

| Ingredient | wt % |
| --- | --- |
| 11% ethyl cellulose (50-52% ethoxyl) dissolved in TEXANOL ™ solvent | 8.4% |
| 8% ethyl cellulose (48-50% ethoxyl) dissolved in TEXANOL ™ solvent | 8.4% |
| tallowpropylenediaminedioleate | 5.7% |
| pentaerythritol ester of hydrogenated rosin | 29.6% |
| gum damar | 4.3% |
| hydrogenated castor oil derivative | 5.7% |
| dibasic ester | 29.6% |
| aromatic solvent | 1.4% |
| TEXANOL ™ solvent | (balance) |

Paste Preparation

Generally stated, the paste compositions herein are prepared by combining the requisite amounts of the inorganic solids, including the oxide component and the Ag powder, in a glass jar and tumble-mixing them for about 15 min. This mixture is added by thirds to a jar containing organic vehicle from the aforementioned masterbatch and mixed after each addition using the aforementioned Thinky® mixer for 1 minute at 2000 RPM, whereby the ingredients are well dispersed in the organic vehicle.

After the final addition, the paste is cooled and the viscosity is adjusted to between about 300 and 400 Pa-s by adding solvent and Thinky mixing for 1 minute at 2000 RPM. The paste is then passed repeatedly through a three-roll mill (for example, a three-roll mill by Charles Ross and Son, Hauppauge, N.Y., with a 25 μm gap, using 3 passes at zero pressure and 3 passes at 100 psi (0.7 MPa)).

Each paste composition is allowed to sit for at least 16 hours after roll milling, and then its viscosity is adjusted to ~300 Pa-s with additional TEXANOL™ solvent to render it suitable for screen printing. Viscosity is conveniently measured using a Brookfield viscometer (Brookfield Inc., Middleboro, Mass.) with a #14 spindle and a #6 cup. Viscosity values may be taken after 3 minutes at 10 RPM. Typically, a viscosity of about 300 Pa-s is found to yield good screen printing results, but some variation, for example ±50 Pa-s or more, would be acceptable, depending on the precise printing parameters.

The degree of dispersion of each paste composition may be measured using commercial fineness of grind (FOG) gauges (Precision Gage and Tool, Dayton, Ohio) in accordance with ASTM Standard Test Method D 1210-05. FOG values are conventionally specified as X/Y, meaning that the size of the largest particle detected is X μm and the median size is Y μm. FOG values of 15/8 or better are typically attained for the present paste composition.

The foregoing process is determined to produce paste composition material that is sufficiently homogenous to achieve reproducible solar cell performance.

Cell Fabrication

Generally stated, electrodes for the exemplary photovoltaic cells below are formed by screen printing the desired paste composition in a preselected pattern onto the opposing major sides of a thin silicon wafer, using a screen printer, such as an AMI-Presco (AMI, North Branch, N.J.) MSP-485 semi-automatic screen printer. The front-side electrodes are formed in a comb-like pattern comprising a large number of fingers extending perpendicularly from bus bars (hereinafter, "bus bar/finger" configuration). The back-side electrodes are formed by screen printing Solamet® PV35C Al-containing paste (available commercially from E.I. DuPont, Wilmington, Del.) or equivalent to produce a full-plane Al—Si eutectic back contact upon firing.

After printing and drying, the cells are fired in a rapid thermal processing, multi-zone belt furnace, such as one provided by BTU International, North Billerica, Mass. For each paste, at least 9 cells are printed, so that 3 cells can be fired at each of at least 3 laddered furnace peak set point temperatures. It is understood that the peak temperature experienced by each cell during passage through the firing furnace in such a process may be about 140 to 150° C. lower than the peak zone temperature.

Electrical Testing

Unless otherwise specified, electrical properties reported herein are measured using a Pulsed Solar Simulator PSS 10II Cell Tester from Berger Lichttechink GmbH & Co. KG. The Xe arc lamp in the I-V tester simulates sunlight with a known intensity and irradiates the front surface of the cell. Tests are carried out on photovoltaic cells at 25±1.0° C. with a light intensity of 1.0 Sun. The tester uses a four contact method to measure current (I) and voltage (V) at multiple load resistance settings to determine the cell's I-V curve. Light energy conversion efficiency (Eff), fill factor (FF), and apparent series resistance ($R_a$) are obtained from the I-V curve for each cell. $R_a$ is defined in a conventional manner as the negative of the reciprocal of the local slope of the I-V curve near the open circuit voltage. As recognized by a person of ordinary skill, $R_a$ is conveniently determined and a close approximation for $R_s$, the true series resistance of the cell.

Tests are carried out after the firing of the photovoltaic cells. For each combination of pastes and wafer type, an optimum firing temperature is identified as the temperature that resulted in the highest mean or median efficiency, based on a 3-cell test group. Mean or median electrical results are reported for the cell groups fired at the optimal firing temperature thus determined. For each furnace condition and run cycle, control cells are made with known commercial wafer samples and conductive pastes. The control cells are included in each firing and thereafter tested. The processing and electrical testing are assumed valid as long as the results for the control cells are within established limits. Of course, the foregoing protocols are exemplary and other equipment and procedures suitable for heat treating and testing efficiencies and other pertinent electrical properties will be recognized by one of ordinary skill in the art.

The adhesion of front-side electrodes is conveniently measured by a pull test as follows. A copper ribbon coated with a Sn/Pb solder (Ulbrich Stainless Steels & Special Metals, Inc.) is dipped into a soldering flux (Kester-952s, Kester, Inc.) and then dried for five seconds in air. Half of the solder coated copper ribbon is placed on the bus electrode and soldering is done using a soldering system (SCB-160, SEMTEK Corporation Co., Ltd.), with the soldering iron temperature set to 190 to 240° C. The remaining part of the copper ribbon not adhered to the electrode is horizontally folded and pulled at 120 mm/min using a testing machine (Peel Force 606, MOGRL Technology Co., Ltd.). The strength (in newtons, N) at which the copper ribbon is detached is recorded as the solder adhesion.

Examples 1-3

Comparative Example CE1

Using the techniques described above, paste compositions are formulated as Examples 1-3. Fusible materials FM-A and FM-B, having the compositions given in Table II and Table III, respectively, are used to provide the oxide component. As measured by the techniques herein, FM-A has a glass transition temperature of about 270° C. and a softening point of about 290° C.; FM-B has a glass transition temperature of about 550° C. and a softening point of about 725° C.

TABLE II

| FM-A: Lead-tellurium-bismuth-based oxide | |
|---|---|
| Oxide | Amount (wt %) |
| PbO | 36.0 |
| $B_2O_3$ | 0.4 |
| $Na_2O$ | 0.2 |
| $Bi_2O_3$ | 10.5 |
| $TeO_2$ | 42.2 |
| $Li_2O$ | 1.7 |
| $WO_3$ | 9.0 |

TABLE III

| FM-B: Bismuth-silicon-zinc-based oxide | |
|---|---|
| Oxide | Amount (wt %) |
| $Bi_2O_3$ | 46.1 |
| $SiO_2$ | 27.7 |
| ZnO | 13.8 |
| $Al_2O_3$ | 4.6 |
| CaO | 3.7 |
| MgO | 4.1 |

Paste for Comparative Example 1 is formulated using the lead-tellurium-bismuth oxide composition FM-A, but without any second fusible material.

The compositions of Examples 1-3 and Comparative Example CE1 are shown in Table IV, with amounts of the constituents in weight percentage of the entire paste composition. These compositions are screen printed on 6×6 inch (15×15 cm) mono-crystalline P-type Si wafer substrates having about 80 Ω/square resistance. A conventionally applied $SiN_x$: $H_y$ anti-reflective coating (ARC) about 70 nm thick is present on the front (sun-facing) major surface of the wafers, which may be obtained from Solar Tech (Taiwan). The paste is applied in a pattern having 100 fingers (40 μm wide) extending from 3 bus bars (1.5 mm wide). Back side electrodes are prepared using an aluminum-containing paste composition available commercially under the trade name SOLAMET® PV35C from E.I. du Pont de Nemours and Co., Wilmington, Del. The wafers and both paste compositions are fired in a six-zone infrared belt-type furnace with a 1.5 min. transit time, with the hottest zone set to 945° C., so that the wafers attain a peak temperature of about 720 to 730° C.

Measured values of the light energy conversion efficiency (EFF) and the adhesion for cells fabricated with the Example 1-3 pastes are shown relative to the values exhibited by cells made with the paste of Comparative Example 1.

TABLE IV

Paste Compositions and Cell Properties

|  | Comparative Example 1 | Example 1 | Example 2 | Example 3 |
|---|---|---|---|---|
| Ag powder | 89.3 | 89.1 | 88.9 | 88.7 |
| First fusible material: FM-A | 1.8 | 1.8 | 1.8 | 1.8 |
| Second fusible material: FM-B | 0 | 0.2 | 0.4 | 0.6 |
| Organic vehicle | 8.9 | 8.9 | 8.9 | 8.9 |
| Relative EFF | 1.000 | 0.999 | 0.996 | 0.988 |
| Relative Adhesion | 1.0 | 1.3 | 1.6 | 2.0 |

(Composition in wt %)

The data of Table IV demonstrate that constructing front-side electrodes with paste compositions wherein a Bi—Si—Zn—O second fusible material is added can raise the adhesion of the electrode by up to twice the value attained without the second fusible material, while lowering the relative electrical efficiency by at most about 1%.

Examples 4-6

Comparative Example CE2

Paste compositions for Examples 4-6 are formulated using fusible materials FM-C and FM-D having compositions given in Tables V and VI.

As measured by the techniques herein, FM-C has a glass transition temperature of about 270° C. and a softening point of about 332° C.; FM-D has a glass transition temperature of about 400° C. and a softening point of about 450° C.

Using the grinding techniques described above, powders of material FM-D are prepared with $d_{50}$ values of 0.6, 1.0, and 1.2 as measured by laser light scattering and used to formulate Examples 4-6, respectively, with 1.6 wt % of first fusible material FM-C and 0.2 wt % of second fusible material FM-D. A paste composition is formulated as Comparative Example CE2 with 1.8 wt % of FM-C, but no FM-D.

TABLE V

FM-C: Lead-tellurium-bismuth-based oxide

| Oxide | Amount (wt %) |
|---|---|
| PbO | 43.2 |
| $B_2O_3$ | 0.5 |
| $Na_2O$ | 0.5 |
| $Bi_2O_3$ | 7.0 |
| $TeO_2$ | 46.3 |
| $Li_2O$ | 0.5 |
| $Cr_2O_3$ | 2.1 |

TABLE VI

FM-D: Bismuth-boron-zinc-based oxide

| Oxide | Amount (wt %) |
|---|---|
| $Bi_2O_3$ | 73.2 |
| $SiO_2$ | 1.9 |
| ZnO | 13.5 |
| $Al_2O_3$ | 0.6 |
| BaO | 2.6 |
| $B_2O_3$ | 8.2 |

The compositions of Examples 4-6 and Comparative Example CE2 are shown in Table VII, with amounts of the constituents in weight percentage of the entire paste composition. Lithium ruthenate ($Li_2RuO_3$) additive, as described in U.S. Pat. No. 8,808,581, is included at 0.1 wt %. These compositions are screen printed on 6×6 inch (15×15 cm) multi-crystalline P-type Si wafer substrates having about 82 Ω/square resistance. A conventionally applied $SiN_x$: $H_y$ anti-reflective coating (ARC) about 70 nm thick is present on the front (sun-facing) major surface of the wafers, which may be obtained from TSEC Corporation (Taiwan). The paste is applied in a pattern having 75 fingers (20 μm wide) extending from 2 bus bars (1.5 mm wide). Back side electrodes are prepared using an aluminum-containing paste composition available commercially under the trade name SOLAMET® PV35C from E.I. du Pont de Nemours and Co., Wilmington, Del. The wafers and both paste compositions are fired as in Examples 1-3.

Measured values of the light energy conversion efficiency (EFF) and the adhesion for cells fabricated with the Example 4-6 pastes are shown relative to the values exhibited by cells made with the paste of Comparative Example 2.

TABLE VII

Paste Compositions and Cell Properties

|  | Comparative Example CE2 | Example 4 | Example 5 | Example 6 |
|---|---|---|---|---|
| Ag powder | 88.8 | 88.8 | 88.8 | 88.8 |
| First fusible material: FM-C | 1.8 | 1.6 | 1.6 | 1.6 |
| Second fusible material: FM-D | 0 | 0.2 | 0.2 | 0.2 |
| Particle size ($d_{50}$) of FM-D (μm) | — | 0.6 | 1.0 | 1.2 |
| $Li_2RuO_3$ | 0.1 | 0.1 | 0.1 | 0.1 |
| Organic vehicle | 9.3 | 9.3 | 9.3 | 9.3 |
| Relative EFF | 1.00 | 1.00 | 1.00 | 0.99 |
| Relative Adhesion | 1.0 | 1.9 | 1.9 | 2.1 |

(Composition in wt %)

The data of Table VII demonstrate that constructing front-side electrodes with paste compositions wherein a Bi—B—Zn—O second fusible material is added can raise the adhesion of the electrode by up to twice its value without the second fusible material, while lowering the relative electrical efficiency by at most about 1%. Changing the particle size of the second fusible material has at most a small effect on the efficiency and adhesion.

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

The presence of the impurities would not substantially alter the chemical and rheological properties of the oxide component, the fusible materials therein, paste compositions made with the oxide, or the electrical properties of a fired device manufactured using the paste composition. For example, a solar cell employing a conductive structure made using the present paste composition may have the efficiency and other electrical properties described herein, even if the paste composition includes impurities.

The embodiments of the oxide compositions and the constituent fusible materials described herein, including the examples herein, are not limiting; it is contemplated that one of ordinary skill in the art of glass chemistry could make minor substitutions of additional ingredients and not substantially change the desired properties of the oxide composition, including its interaction with a substrate and any insulating layer thereon.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A paste composition, comprising:
an inorganic solids portion that comprises:
  (a) 85 to 99.75% by weight of the solids of a source of electrically conductive metal, and
  (b) 0.25 to 15% by weight of the solids of an oxide-based component comprising a first fusible material and a separate second fusible material, and
an organic vehicle in which the constituents of the inorganic solids portion are dispersed,
and wherein the first fusible material is one of a lead-tellurium-oxide (Pb—Te—O) composition, a lead-tellurium-boron-oxide (Pb—Te—B—O) composition, a lead-tellurium-lithium-oxide (Pb—Te—Li—O) composition, or a mixture thereof and the second fusible material is a bismuth-silicon-oxide that comprises, by weight percent:
30 to 80% $Bi_2O_3$,
1 to 50% $SiO_2$,
0 to 40% ZnO,
0 to 22% $TeO_2$,
0 to 12% $B_2O_3$,
0 to 6% MgO,
0 to 9% CaO,
0 to 15% BaO,
0 to 7% $Al_2O_3$,
0 to 12% $Na_2O$,
0 to 8% $Li_2O$, and
0 to 4% $Fe_2O_3$.

2. The paste composition of claim 1, wherein the electrically conductive metal comprises silver.

3. The paste composition of claim 1, wherein the first fusible material comprises:
30 to 65 wt % PbO, and
30 to 65 wt % $TeO_2$.

4. The paste composition of claim 1, wherein the first fusible material further comprises 5-18 wt % $Bi_2O_3$.

5. The paste composition of claim 1, wherein the first fusible material is substantially silicon-free.

6. The paste composition of claim 1, wherein the second fusible material is at most about 40% by weight of the oxide-based component.

7. The paste composition of claim 1, wherein the first and second fusible materials respectively have first and second glass transition temperatures ($T_{g1}$, $T_{g2}$) and a difference $\Delta T_g = T_{g2} - T_{g1}$ is at least 100° C.

8. The paste composition of claim 1, wherein the first and second fusible materials respectively have first and second softening points ($T_{s1}$, $T_{s2}$) and a difference $\Delta T_s = T_{s2} - T_{s1}$ is at least 100° C.

9. The paste composition of claim 1, wherein the first fusible material is substantially free of silicon and the second fusible material is substantially free of boron.

10. A process comprising:
 (a) providing a semiconductor substrate comprising an insulating layer situated on at least one surface of the semiconductor substrate;
 (b) applying a paste composition as recited by claim 1 onto at least a portion of the insulating layer, and
 (c) firing the semiconductor substrate, the insulating layer, and the paste composition, such that the insulating layer is penetrated and the electrically conductive metal is sintered, whereby an electrode that electrically contacts the semiconductor substrate is formed.

11. An article made by a process comprising:
 (a) providing a semiconductor substrate comprising an insulating layer situated on at least one surface of the semiconductor substrate;
 (b) applying a paste composition as recited by claim 1 onto at least a portion of the insulating layer, and
 (c) firing the semiconductor substrate, the insulating layer, and the paste composition, such that the insulating layer is penetrated and the electrically conductive metal is sintered, whereby an electrode that electrically contacts the semiconductor substrate is formed.

12. A paste composition, comprising:
an inorganic solids portion that comprises:
 (a) 85 to 99.75% by weight of a source of electrically conductive metal, and
 (b) 0.25 to 15% by weight of an oxide-based component comprising a first fusible material having a first glass transition temperature ($T_{g1}$) and a first softening point ($T_{s1}$), and a separate second fusible material having a second glass transition temperature ($T_{g2}$) and a second softening point ($T_{s2}$), $T_{g2}$ being higher than $T_{g1}$ and $T_{s2}$ being higher than $T_{s1}$, such that a difference $\Delta T_s = T_{s2} - T_{s1}$ is at least 100° C., and an organic vehicle in which the constituents of the inorganic solids portion are dispersed.

13. The paste composition of claim 12, wherein a difference $\Delta T_g = T_{g2} - T_{g1}$ is at least 100° C.

14. The paste composition of claim 12, wherein:
 (a) the first fusible material is one of a lead-tellurium-oxide (Pb—Te—O) composition, a lead-tellurium-boron-oxide (Pb—Te—B—O) composition, or a lead-tellurium-lithium-oxide (Pb—Te—Li—O) composition; and
 (b) the second fusible material is a bismuth-silicon-oxide that comprises, by weight percent:
 30 to 80% $Bi_2O_3$,
 1 to 50% $SiO_2$,
 0 to 40% ZnO,
 0 to 22% $TeO_2$,
 0 to 12% $B_2O_3$,
 0 to 6% MgO,
 0 to 9% CaO,
 0 to 15% BaO,
 0 to 7% $Al_2O_3$,
 0 to 12% $Na_2O$,
 0 to 8% $Li_2O$, and
 0 to 4% $Fe_2O_3$.

15. A process comprising:
 (a) providing a semiconductor substrate comprising an insulating layer situated on at least one surface of the semiconductor substrate;
 (b) applying a paste composition as recited by claim 12 onto at least a portion of the insulating layer, and
 (c) firing the semiconductor substrate, the insulating layer, and the paste composition, such that the insulating layer is penetrated and the electrically conductive metal is sintered, whereby an electrode that electrically contacts the semiconductor substrate is formed.

16. An article made by a process comprising:
 (a) providing a semiconductor substrate comprising an insulating layer situated on at least one surface of the semiconductor substrate;
 (b) applying a paste composition as recited by claim 15 onto at least a portion of the insulating layer, and
 (c) firing the semiconductor substrate, the insulating layer, and the paste composition, such that the insulating layer is penetrated and the electrically conductive metal is sintered, whereby an electrode that electrically contacts the semiconductor substrate is formed.

17. The paste composition of claim 12, wherein the difference $\Delta T_g$ is at least 200° C.

18. The paste composition of claim 12, wherein the difference $\Delta T_s$ is at least 200° C.

* * * * *